United States Patent [19]

Clemons

[11] 3,983,391

[45] Sept. 28, 1976

[54] OPTICAL ENCODER OF THE REFLECTIVE TYPE

[75] Inventor: Calvin Clemons, Boston, Mass.

[73] Assignee: Itek Corporation, Lexington, Mass.

[22] Filed: May 21, 1975

[21] Appl. No.: 579,516

[52] U.S. Cl. .................... 250/237 G; 250/231 SE
[51] Int. Cl.² ......................................... H01J 3/14
[58] Field of Search ...... 250/231 R, 231 SE, 237 R, 250/237 G; 356/169, 170; 324/175; 340/347 P

[56] References Cited
UNITED STATES PATENTS

| | | | |
|---|---|---|---|
| 3,524,067 | 8/1970 | West | 250/237 G |
| 3,544,988 | 12/1970 | Astheimer | 250/237 G |
| 3,742,486 | 6/1973 | Skidmore | 340/347 P |
| 3,833,807 | 9/1974 | Takeda | 250/231 R |
| 3,842,261 | 10/1974 | MacGovern et al. | 356/169 |
| 3,879,136 | 4/1975 | Takeda | 250/231 SE |

Primary Examiner—David C. Nelms
Attorney, Agent, or Firm—Homer O. Blair; Robert L. Nathans; Gerald H. Glanzman

[57] ABSTRACT

Reflective optical encoder for monitoring the movement of a machine tool component or the like. The encoder comprises a code disc having a code track thereon in the form of alternating radiation transmissive and radiation opaque areas. A source of radiation and at least two detectors are supported on one side of the code disc while a reflector is supported on the opposite side. Radiation from the source is directed through the code track to the reflector and is reflected off of the reflector back through the code track to the detectors such that the detectors will receive radiation modulated by the code track as a function of the movement of the code disc.

The reflector is preferably provided with an aspheric reflector surface, and most preferably, with a conical reflector surface which can be adjusted in orientation to enable radiation directed to one of the detectors to be retarded in phase by desired amounts relative to radiation directed to the other detector to permit maximizing of the system resolution and to determine direction of rotation.

The encoder system provided eliminates the need for the slit plate of conventional encoders and, in general, provides a low cost, medium resolution encoder having a minimum number of parts and reduced tolerance requirements.

13 Claims, 1 Drawing Figure

U.S. Patent  Sept. 28, 1976  3,983,391
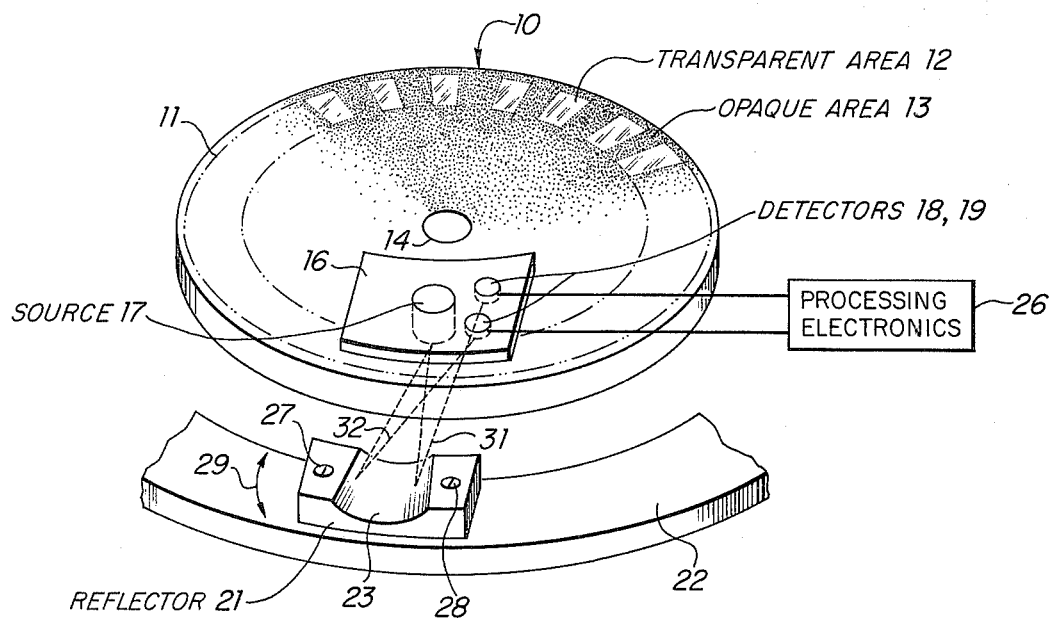

OPTICAL ENCODER OF THE REFLECTIVE TYPE

BACKGROUND OF THE INVENTION

1. Field of the Invention

The present invention relates generally to the field of optical encoders, and, more particularly, to a low cost optical encoder of the reflective type capable of providing moderate resolution while requiring only a minimum number of wide tolerance parts.

2. Description of the Prior Art

Optical encoders are widely utilized in industry to measure linear or angular displacements of machine tools or other components. Basically, such systems operate by detecting and measuring the movement of markings on a moveable element as that element moves relative to a fixed reference. In conventional encoders, the moveable element comprises a code disc coupled to the machine component being monitored and having one or more code tracks thereon in the form of periodic patterns of alternating radiation transmissive and radiation opaque areas or increments. A source of illumination is usually placed on one side of the code disc and directed through the pattern on the disc. A stationary aperture or slit plate having a pattern similar to that of the code disc is then inserted between the code disc and a suitable detector located on the opposite side of the code disc from the radiation source. As the code disc rotates, the combination of disc and slit patterns will modulate the radiation incident upon the detectors and this modulation is detected and processed to form the coded word representing shaft position.

With this basic construction, encoders can read relatively fine code patterns and can deliver very accurate results (for example, code patterns of 1,000 cycles per inch or more are not uncommon). For encoders of this type to provide the required accuracy, however, they must be manufactured within very narrow tolerances. Specifically, each of the components in the encoder must be very accurately positioned and aligned relative to one another during manufacture. Furthermore, because encoders are frequently utilized in fairly severe environments, for example, in machines which vibrate substantially or undergo significant temperature variations, a substantial amount of care must be taken to ensure that the encoder remains accurately aligned at all times. Because of the precision required in such encoders, they are generally quite expensive and this limits the practicality of their use in industry.

In addition, for many applications, it is desirable to be able to obtain a resolution that is better than can be effectively obtained by merely reading the code patterns on the code plate. Specifically, the number of cycles (one cycle being an adjacent light transmissive and light opaque area of the code pattern) that can be placed on a code disc is limited by diffraction effects as well as by mechanical tolerances. To overcome this problem, a system has been previously developed by which a single cycle on a code disc can be electronically broken down into several parts. This concept, which is described in detail in, for example, U.S. Patent Nos. 3,265,902, 3,303,347 and 3,312,828, basically consists of providing two or more detectors positioned relative to one another and relative to the code disc such that the radiation striking them after passing through the code and slit plates will be 90° out-of-phase with respect to a code track cycle. These two out-of-phase signals can be considered as sine and cosine signals, and, as such, can be electronically processed, as by a vector summing procedure, to provide several signals which effectively break a cycle into several smaller parts to provide greater resolution.

SUMMARY OF THE PREFERRED EMBODIMENTS

In accordance with the present invention, an improved encoder system is provided which is effective in providing a medium to high resolution output, while, at the same time, requires only a minimum number of wide tolerance parts. In accordance with the presently most preferred embodiment of the invention, the system employs a code disc or other coded member upon which a code pattern of alternating light transmissive and light opaque areas have been formed as in the prior art. Supported on one side of the code disc is a source of radiation for directing radiation through the code pattern on the disc and a pair of spaced detectors for receiving the radiation after it has been modulated by the movement of the code pattern on the disc. On the opposite side of the code disc is a novel reflector element, preferably having an aspherical reflecting surface, and most preferably having a tapered cylindrical or conical surface. The radiation passing through the code disc will impinge upon the reflector and be reflected back through the code disc to ultimately impinge upon the detectors. Because the radiation from the radiation source will pass through the code pattern on the disc twice before reaching the detectors, the code dis, in effect, functions as both the code disc and the slit plate of the prior art systems and, hence, the slit plate may be eliminated from the system.

Because of the aspherical shape of the reflector, the radiation striking it will be reflected back through the code disc along differing paths, and, by adjusting the orientation of the reflector relative to the detectors, it becomes possible to advance or retard the radiation with respect to each detector thus controlling the phase relationship between the radiation striking each detector. By adjusting the reflector to establish a 90° phase difference relative to a code pattern cycle, the vector summing techniques described in the previously referred to patents can be employed to resolve a single cycle into smaller increments.

Additionally, because of the adjustment capability of the reflector, the encoder system itself need not be initially manufactured to very precise tolerances. For example, the spacing between the reflector and the code disc can be varied within wide limits and then corrected for by a simple adjustment of the reflector. This capability significantly reduces the manufacturing cost of the system.

The encoder system provided by the present invention is believed to have the greatest value in those applications requiring a resolution of between 100 and 500 cycles per inch, although greater resolution is believed to be obtainable, if desired. Yet further advantages and features of the invention will be set forth hereinafter in conjunction with the detailed description of the preferred embodiment.

BRIEF DESCRIPTION OF THE DRAWING

The FIGURE illustrates, in somewhat schematic form, the encoder system according to a presently preferred embodiment of the invention.

DETAILED DESCRIPTION OF THE PREFERRED EMBODIMENT

The FIGURE illustrates a presently most preferred embodiment of the invention. In the FIGURE, reference number 10 refers to the code disc which is provided with an annular code track 11 made up of a pattern of alternating radiation transmissive and radiation opaque areas 12 and 13, respectively. The code track can be formed on the disc by any conventional technique and can comprise from about 100 to about 1,000 cycles per inch (a cycle consists of one alternating transparent and opaque area). In the FIGURE, the size of the areas 12 and 13 is obviously greatly exaggerated for purposes of clarity. In the embodiment illustrated, only a single annular code track is provided on the disc, although, as is recognized in the art, for certain applications a number of concentric tracks having different increment arrangements may be provided with each track having its own optical system associated therewith.

The code disc 10 is provided with an axial aperture 14 by which it is adapted to be coupled, either directly or through intermediate structure, to the machine tool component whose position is to be monitored. For purposes of clarity, the machine tool component and the coupling structure is not illustrated.

Supported on one side of the code disc 10 and adjacent to the code track 11 is a rigid support member 16 which supports a suitable radiation source 17, such as a light emitting diode and a pair of detectors 18 and 19. As is common in the encoder art, the light emitting diode is preferably of the type that will emit infrared radiation while the detectors are of the type that are responsive to such radiation.

The support 16 is rigidly secured to and supported by the external housing of the encoder system, not illustrated, and is maintained stationary relative to the code disc which will be moveable with the machine tool component to which it is mounted. The spacing between the support 16 and the code disc 10 is preferably kept quite small but for reasons to be explained hereinafter, precise tolerances are not required. Also, for reasons to be explained hereinafter, the two detectors 18 and 19 are preferably spaced one above the other on either side of the center line of the code track 11, while the source 17 is centered between the two detectors on the center line of the code track.

Supported on the opposite side of the code disc from the support 16 is a reflector element 21. This reflector is supported on base member 22 which may be part of the encoder housing, and is provided with a reflective surface 23. Surface 23 is preferably of an aspherical shape and most preferably of a tapered cylindrical or conical shape for reasons to be explained hereinafter. The function of the reflector is to receive radiation passing through the transparent areas 12 of the code track 11 and to reflect it back through the code pattern to the detectors 18 and 19, and, accordingly, it is supported substantially in alignment with source 17 and detectors 18 and 19.

The encoder system operates as follows: as the code disc is driven into rotation by the machine tool element to which it is attached, the code pattern with its alternating radiation opaque and radiation transmissive areas will pass beneath the source 17, and radiation from source 17 will pass through the transparent areas 12 and impinge upon the reflector surface 23. A portion of this radiation will be reflected back through the code disc and will impinge upon the two detectors 18 and 19. As the radiation passes through the transparent portions of the code track, it will be modulated as a function of the number of code pattern cycles that have crossed the source and, hence, as a function of the extent of disc rotation. Because the radiation passes through the code disc twice before ultimately reaching the detectors, the code disc 10 will effectively function both as the code disc and as the slit plate of conventional encoders. Also, it should be apparent that since the code disc will appear twice in the imaging process, the spatial frequency of the detector output will actually be twice the spatial frequency of the code track, which, of course, can readily be accounted for in the processing electronics.

Because the radiation source 17 is centered between the two detectors 18 and 19, radiation from the source travelling to the detectors via the reflector will travel on slanted ray paths. By utilizing this feature in conjunction with an aspherical reflector surface 23, the paths of travel of the radiation reaching the detectors can be controlled. This is schematically illustrated in the FIGURE wherein radiation from source 17 impinges upon reflecting surface 23 and radiation striking different parts of the surface will reflect at different angles such that some of the reflected radiation (e.g., rays 31 and 32) will reach each of the detectors 18 and 19. Because reflector surface 23 is aspheric, its orientation relative to the radiation from source 17 can be adjusted to advance or retard the radiation with respect to each detector. This, in turn, permits the radiation reaching the two detectors to be adjusted to be out-of-phase with respect to each other by any desired fraction of a code track cycle. Preferably, this phase difference is selected to be 90° because this will provide sine and cosine signal outputs from the two detectors which can then be processed electronically in the manner described in the previously referred to U.S. Patent Nos. 3,265,902, 3,303,347 and 3,312,828, so as to break a cycle into smaller parts to increase system resolution, and also to provide information regarding the direction of code disc movement. The details of suitable electronics for carrying out this processing are set out in these patents, and, therefore, are not described herein but are merely illustrated schematically as Processing Electronics 26.

In order to control the phase relationship between the radiation reaching each of the detectors, it is only necessary to adjust the position of aspheric reflecting surface 23 relative to source 17. This can conveniently be accomplished by mounting the reflector 21 for pivotal movement around pivot screw 27. Specifically, by removing lock screw 28, and then pivoting the reflector around pivot screw 27 back and forth as indicated by arrow 29 until it is in a proper position relative to the rest of the system, and by then locking the reflector into that position, effective adjustment can be simply accomplished by merely monitoring the detector outputs until the proper relationships are present.

Because of this adjustment capability, it is possible not only to adjust the system for phasing purposes, but also to correct any initial manufacturing inaccuracies that might exist. This enables the system to be manufactured with very loose tolerances. In most encoders, the gap between the code disc and, for example, the slit plate, is critical. With the present invention, however, a gap range of 0.001 to 0.125 inch between the disc and the reflector can readily be accommodated by simply adjusting the reflector.

Although, in the presently most preferred embodiment, a tapered cylindrical or conical reflector is employed, other aspherical surfaces and, possibly, spherical surfaces properly designed to produce the desired out-of-phase relationships can be used as well. The conical reflector is most preferred at this time because the alternating opaque and transparent areas on the code pattern are themselves generally conical or pie-shaped, and, it has been found that when the reflector is provided with a taper approximately equal to that of the code areas that better phase control is possible, modulation incident on the detectors is maximized, and, in general, better overall performance is attained.

With the encoder system provided, essentially any of the operations performed by conventional encoders can be carried out. For example, push-pull detection can be used to minimize the effect of light source and power supply variation. Multiple station averaging may also be incorporated into the system, if desired. This can readily be accomplished by maintaining the reflector on an intermediate plate which, in turn, can be translated. Translation circumferentially around the disc can be used to phase the stations while pivoting of the reflector will set the sine-cosine phasing. The various electronics and structures for carrying out these various functions are all known in the art and do not form part of the present invention.

In conclusion, the use of a reflective encoder having an aspherical reflecting surface provides extreme simplicity of construction and ease of manufacture. The system is quite inexpensive to manufacture and can be utilized in a great many applications where encoder systems are desirable. The resolution that can be obtained with this system is competitive with many other encoder systems costing a great deal more.

Although what has been described is a presently most preferred embodiment, it should be understood that the invention could take many other forms and that additions, modifications, and omissions may be made from the embodiment described without departing from the scope of the invention. Accordingly, it should be understood that the invention should be limited only insofar as required by the scope of the following claims.

What is claimed is:

1. Encoder apparatus comprising:
   A. a code member, said code member having code track means thereon, said code track means comprising a pattern of alternating radiation transmissive and radiation opaque areas; and,
   B. monitoring means for monitoring relative movement of said code member, said monitoring means comprising:
      a. source means supported on one side of said code member for directing radiation to said code track means;
      b. detector means responsive to radiation from said source means, said detector means including at least first and second detector means for generating first and second signals, respectively, proportional to the radiation impinging thereon;
      c. reflector means supported on the opposite side of said code member from said source means for receiving radiation passing through said code track means from said source means and for reflecting at least a portion of said received radiation back through said code track means to said first and second detector means whereby said first and second detector means will each be impinged by radiation modulated by said code track means as a function of the relative movement of said code member and will generate signals indicative of said relative movement of said code member, said reflector means including an aspheric reflecting surface for directing radiation to said first detector means out of phase with respect to radiation directed to said second detector means; and,
   d. processing means coupled to said first and second detector means for processing said first and second signals.

2. Apparatus as recited in claim 1 wherein an adjacent radiation transmissive and radiation opaque area of said code track means comprises a code track cycle, and wherein said aspheric reflector surface includes means for directing radiation to said first detector means which is out-of-phase relative to a code track cycle with respect to radiation directed to said second detector means.

3. Apparatus as recited in claim 2 wherein said aspheric reflector surface includes means for directing radiation to said first detector means which is 90° out-of-phase relative to a code track cycle with respect to radiation directed to said second detector means.

4. Apparatus as recited in claim 1 wherein said aspheric reflecting surface comprises a conical reflecting surface.

5. Apparatus as recited in claim 1 wherein said reflector means includes adjustment means for adjusting the orientation of said aspheric reflecting surface relative to said first and second detector means for adjusting the phase difference between radiation directed to said first and second detector means.

6. Apparatus as recited in claim 5, wherein said aspheric reflecting surface comprises a conical reflecting surface and wherein said adjustment means comprises means for pivoting said conical reflecting surface around an axis generally perpendicular to the axis of said conical surface.

7. Apparatus as recited in claim 4 wherein said code member comprises a code disc, said code track means comprises an annular code track having alternating radiation transmissive and radiation opaque areas which are tapered toward said disc center, and wherein said conical reflecting surface has a taper generally equal to the taper of said tapered areas on said code track means.

8. Encoder apparatus for monitoring the movement of a moveable element comprising:
   A. a code member coupled to and moveable with said moveable element, said code member having code track means comprising a pattern of alternating radiation transmissive and radiation opaque areas; and,
   B. monitoring means for monitoring the movement of said code member and, hence, of said moveable element, said monitoring means comprising:
      a. source means supported on one side of said code member for directing radiation to said code track means;
      b. detector means responsive to radiation from said source means, said detector means including at least first and second detector means for generating first and second signals, respectively, proportional to the radiation impinging thereon;

c. reflector means having an aspheric reflecting surface supported on the opposite side of said code member from said source means for receiving radiation passing through said code track means from said source means and for reflecting at least a portion of said received radiation back through said code track means to said first and second detector means whereby said first and second detector means will each be impinged by radiation modulated by said code track means as a function of the movement of said code member and will generate signals indicative of said movement of said code member; and, d. processing means coupled to said first and second detector means for processing said first and second signals.

9. Apparatus as recited in claim 8 wherein said reflector means includes means for directing radiation to said first detector means out-of-phase with respect to radiation directed to said second detector means.

10. Apparatus as recited in claim 9 wherein an adjacent radiation transmissive and radiation opaque area of said code track means comprises a code track cycle, and wherein said reflector means includes means for directing radiation to said first detector means which is out-of-phase relative to a code track cycle with respect to radiation directed to said second detector means.

11. Apparatus as recited in claim 9 wherein said reflector means includes adjustment means for adjusting the orientation of said aspheric reflecting surface relative to said first and second detector means for adjusting the phase difference between radiation directed to said first and second detector means.

12. Apparatus as recited in claim 11 wherein said aspheric reflecting surface comprises a conical reflecting surface and wherein said adjustment means comprises means for pivoting said conical reflecting surface around an axis generally perpendicular to the axis of said conical surface.

13. Apparatus as recited in claim 12 wherein said code member comprises a code disc, said code track means comprises an annular code track having alternating radiation transmissive and radiation opaque areas which are tapered towards the center of said code disc, and wherein said conical reflecting surface has a taper generally equal to the taper of said tapered areas on said code track means.

* * * * *